United States Patent [19]

Kobayashi

[11] Patent Number: 4,825,276

[45] Date of Patent: Apr. 25, 1989

[54] INTEGRATED CIRCUIT SEMICONDUCTOR DEVICE HAVING IMPROVED WIRING STRUCTURE

[75] Inventor: Masaharu Kobayashi, Tokyo, Japan

[73] Assignee: NEC Corporation, Japan

[21] Appl. No.: 64,996

[22] Filed: Jun. 18, 1987

[30] Foreign Application Priority Data

Jun. 19, 1986 [JP] Japan .................................. 61-144365

[51] Int. Cl.⁴ ...................... H01L 27/10; H01L 27/02; H01L 29/34
[52] U.S. Cl. .......................................... 357/45; 357/40; 357/47; 357/49; 357/54; 357/71
[58] Field of Search ................... 357/45, 45 M, 71, 40, 357/47, 49, 54

[56] References Cited

U.S. PATENT DOCUMENTS

| | | | |
|---|---|---|---|
| 4,500,906 | 2/1985 | Ohno et al. | 357/45 |
| 4,523,106 | 6/1985 | Tanizawa et al. | 357/45 |
| 4,654,689 | 3/1987 | Fujii | 357/45 |
| 4,661,815 | 4/1987 | Takayama et al. | 357/45 |

FOREIGN PATENT DOCUMENTS 59-158536  9/1984  Japan .................................... 357/71

Primary Examiner—Andrew J. James
Assistant Examiner—Ngan Van Ngo
Attorney, Agent, or Firm—Laff, Whitesel, Conte & Saret

[57] ABSTRACT

An integrated circuit semiconductor device having an improved power supply wiring structure is disclosed. The wiring includes a wide conductive layer and a plurality of stripe type narrow conductive layers formed on the wide conductive layer via an insulating film. Each of stripe type conductive layers is connected to the wide conductive layer through a plurality of contact holes provided in the insulating film.

7 Claims, 5 Drawing Sheets

INTEGRATED CIRCUIT SEMICONDUCTOR DEVICE HAVING IMPROVED WIRING STRUCTURE

BACKGROUND OF THE INVENTION

The present invention relates to an integrated circuit semiconductor device having an improved wiring structure and more particularly, to a power supply wiring for a gate array type integrated circuit device.

In the gate array technique, various basic circuits such as TTL output buffer circuits and ECL output buffer circuits are fabricated in advance on a master substrate and "personalization wirings" or "application specific wirings" are made by interconnecting selected basic circuits and connecting power supply lines to selected basic circuits to obtain a desired function for a specific application.

The power supply lines are generally made of a wiring layer which should have a thickness as large as possible in order to reduce a resistivity thereof and decrease an unfavorable level shift in the wiring layer. However, the thickness of a single conductive layer such as aluminum layer has a limit, for example, of 2 μm or less because of fine patterning, uniformity of the thickness and reliable maintenance of manufacturing apparatus such as vacuum evaporation apparatus by which the layer is formed. It has been accordingly practised to form the power supply line or a signal line of a low resistivity with double conductive layers, a lower layer and an upper layer superposed thereon via insulating film and electrically connected to the lower layer through a plurality of contact holes formed in the insulating film. The two layers have the same pattern or shape in a plan view.

The double-layer low-resistivity power supply or signal line requires at least three masks for formation thereof on the integrated circuit substrate, a first mask for the lower-level layer, a second mask for the contact holes and a third mask for the upper-level layer. A different double-layer line requires different three masks. In other words, three masks must be newly designed and produced when a pattern of the double-layer line is changed. This is disadvantageous, particularly in the gate array device in which a large number of masks are fixed and only such masks are changed in accordance with a function required for the specific application that are necessary to form the personalization wirings.

SUMMARY OF THE INVENTION

It is therefore an object of the present invention to provide an integrated circuit semiconductor device having a double-layer low-resistivity line in which a change in pattern of the double-layer low-resistivity line does not bring about a complete change in a plurality of masks.

The present invention is featured in that either upper-level layer or the lower-level layer is comprised of a plurality of parallel-arrayed unit stripes of the conductive material which have the same length and the same width. The length may be different in a different group of the unit stripes. The width is made small, not more than a possible narrowest width of the line. A pattern of the contact holes is fixedly determined in accordance with the pattern of the unit stripes of the upper-level (or lower-level) layer. A pattern of the lower-level (or upper-level) layer is determined in accordance with the layout of the double-layer line such that it is overlapped by (or overlaps) one or a plurality of the unit stripes of the upper-level (or lower-level) layer.

The semiconductor integrated circuit of the invention comprises a semiconductor substrate, first and second conductive layers of a first level formed on the substrate via an insulating layer and extending in one direction, and at least three stripe type conductive layers of a second level formed on the substrate via an insulating film and arrayed in parallel with each other with a constant interval, each extending in the one direction. Each of the stripe type conductive, layers has the width equal to or narrower than the widths of the first and second conductive layers and is positioned above (or below, as shown in FIG. 1C') either the first or the second conductive layer so as to overlap it or to be overlapped thereby and connected to the overlapped first or second conductive layer via a plurality of contact holes arrayed in the one direction and formed in the insulating film between the stripe type conductive layer. The number of the stripe type conductive layers may be four or more. The double-layer wiring structure of the present invention may be employed in a gate array type integrated circuit semiconductor device.

DESCRIPTION OF THE EMBODIMENTS

Figure 1A:
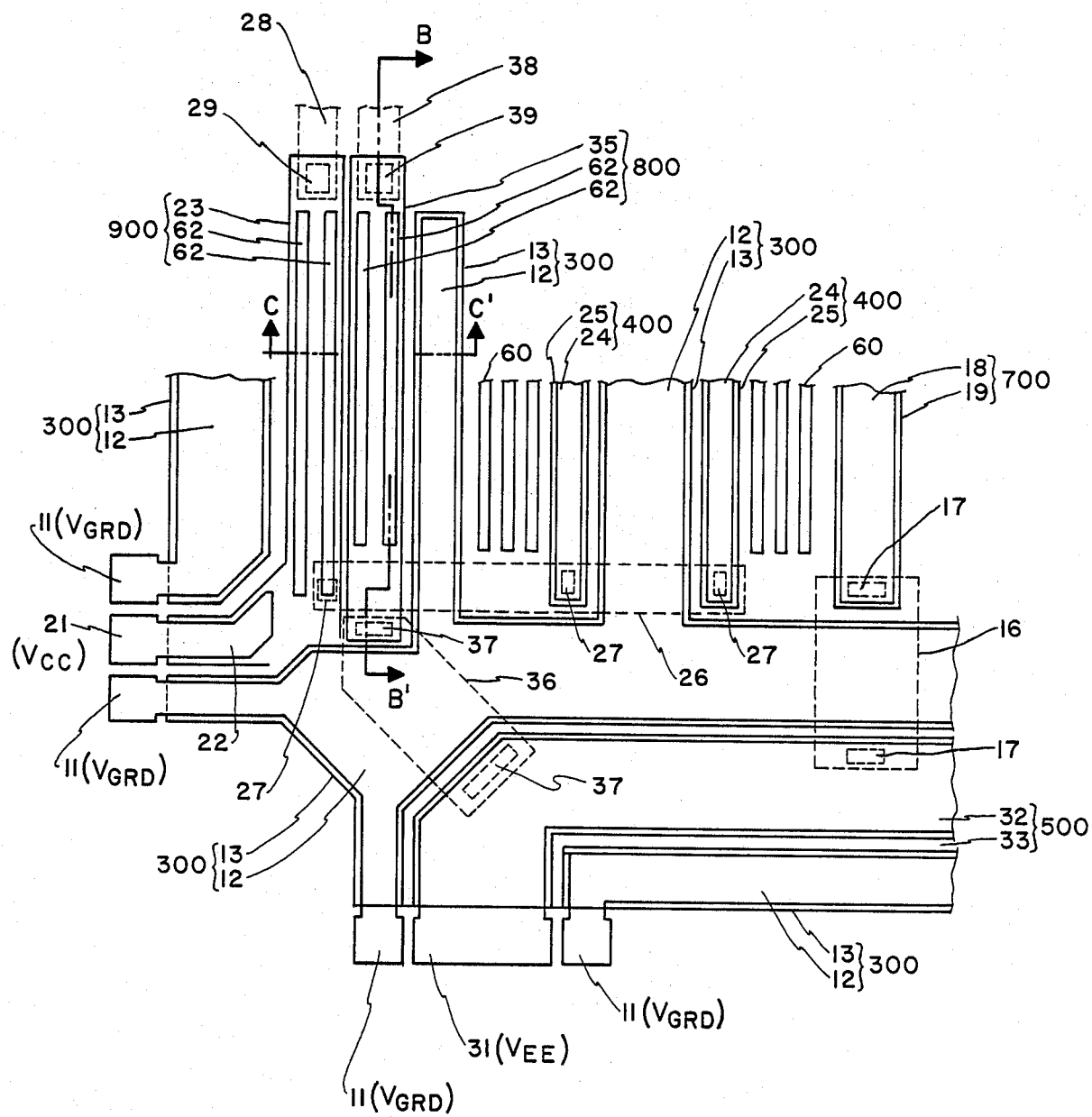
FIG. 1A, FIG. 2A and FIG. 3 are plan views showing embodiments of the present invention.
Figure 1B:
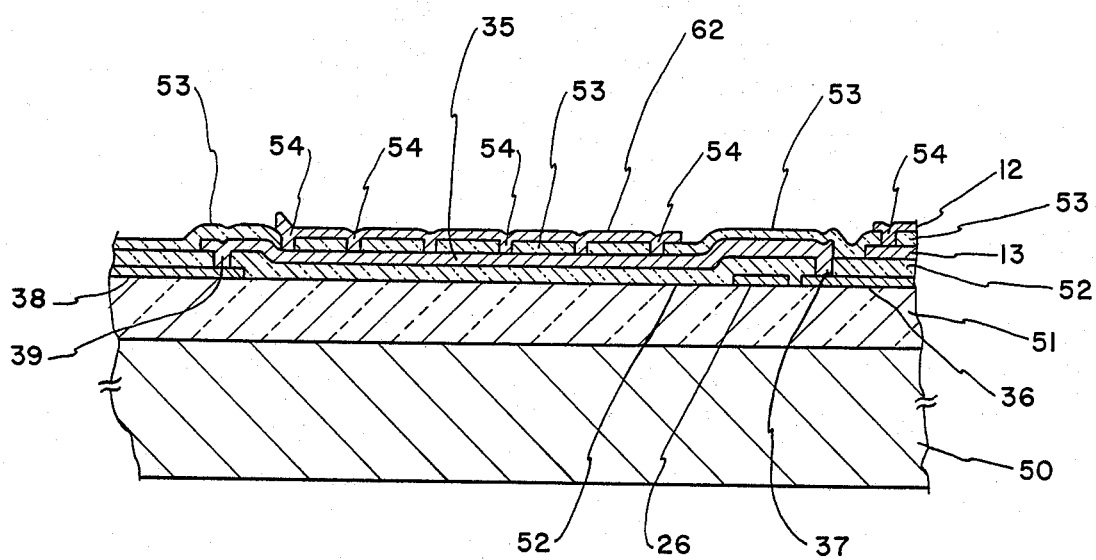
FIG. 1B and FIG. 2B are cross-sectional views taken along lines B-B' in FIG. 1A and FIG. 2A as viewed in the direction of arrows, respectively.
Figure 1C:
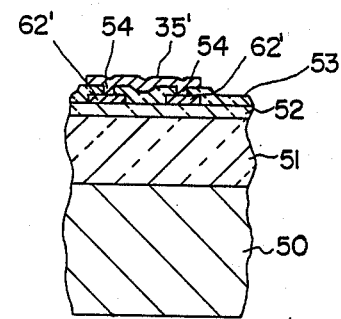
FIG. 1C and FIG. 2C are cross-sectional views taken along lines C-C' in FIG. 1A and FIG. 2A as viewed in the direction of arrows, respectively FIG. 1C' is the same as a fragment of FIG. 1C, except that the positions of layers 62 and 35 are reversed, as shown at 62' and 35''.
Figure 1C:
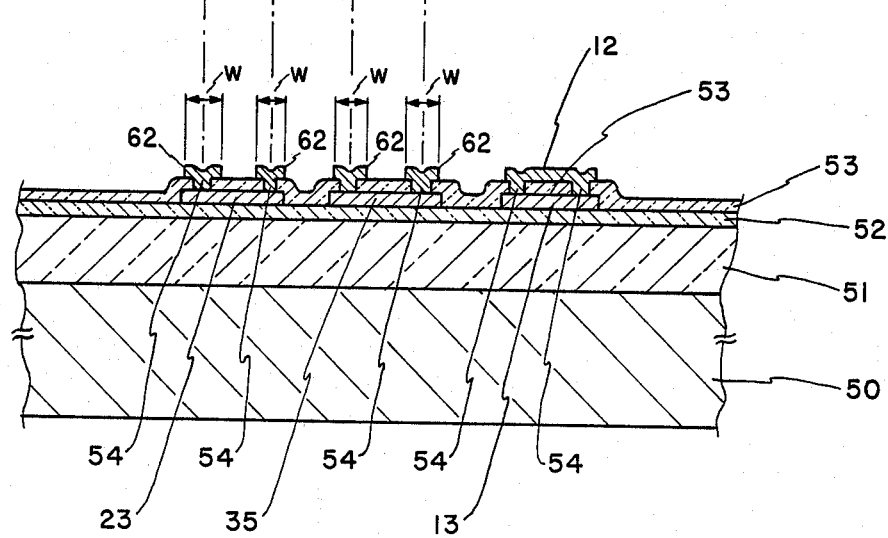

Referring to FIGS. 1A to 1C which show power supply wiring lines of one peripheral portion of a TTL and ECL input/output mixed type gate array integrated circuit chip, the power supply wiring lines comprise a highest-potential power supply voltage (Vcc) line 900 and 400, intermediate-potential power supply voltage (ground) line 300 and a lowest-potential power supply voltage ($V_{EE}$) line 500, 700 and 800. These three kinds of lines are made of aluminum layer. The aluminum layers for signal lines and the power supply lines are formed at first, second and third levels on the field silicon oxide film 51 provided on the major surface of the silicon substrate 50 with intermediate insulating films 52 and 53. The $V_{EE}$ line 500 is electrically connected to the bonding pad 31 of the third level aluminum layer and includes the lower aluminum layer 33 of the second level and the upper aluminum layer 32 of the third level which is continuously extended from the bonding pad 31 and electrically connected to the lower aluminum layer 33 through a plurality of contact holes (not shown in FIG. 1A but similar to contact holes 54 in FIGS. 1B and 1C). The $V_{EE}$ line 700 includes the lower aluminum layer 19 of the second level electrically connected to the lower aluminum layer 33 of the line 500 via the aluminum layer 16 of the first level to which the layers 33 and 19 are connected through the contact holes 17 provided in the intermediate film 52. The $V_{EE}$ line 700 further includes the upper aluminum layer 18 of the third level connected to the lower aluminum layer 19 through a plurality of contact holes (not shown but similar to the contact holes 54 in FIGS. 1B and 1C). The $V_{EE}$ line 800 is comprised of the lower aluminum layer 35 of the second level connected to the lower aluminum layer 33 of the line 500 via the aluminum layer 36 of the first level which is connected to the layers 33 and 35 through contact holes 37 provided in the intermediate insulating film 52 and, two stripe type upper aluminum layers 62 of the third level. Each of the upper layers 62 is connected to the lower aluminum layer 35 through a plurality of contact holes 54 (FIG. 1B and FIG. 1C) provided in the intermediate insulating film 53. The $V_{EE}$ line 800 is connected to ECL output buffer circuits (not shown) via the aluminum layer 38 of the first level which is connected to the lower layer 35 of the line 800 through the contact hole 39.

The $V_{GND}$ line 300 includes a plurality of stem lines (shown in FIG. 1A are three) connected to a plurality of aluminum bonding pads 11 of the third level (shown are four) and a plurality of branch lines (shown are two) extended from the stem line. Each of the stem and branch lines has the lower aluminum layer 13 of the second level and the upper aluminum layer 12 of the third level which is connected to the lower aluminum layer 13 through a plurality of contact holes (not shown). The bonding pads 11 are connected to the upper aluminum layers 12.

The Vcc line 900 includes the lower aluminum layer 23 the second level which is connected to TTL output buffer circuits (not shown) via the aluminum layer 28 of the first level which is in turn connected to the layer 23 through the contact hole 29. The Vcc line 900 further includes two stripe type upper aluminum layers 62 of the third level and a short wiring 22 of the upper aluminum layer of the third level connected to the bonding pad 21. Each of stripe type upper aluminum layers 62 is connected to the lower aluminum layer 23 through contact holes 54 shown in FIG. 1C. The short wiring 22 of the third level is continuously extended from the bonding pad 21 and connected to the lower aluminum layer 23 through a plurality of contact holes (not shown). Other Vcc lines 400 have the lower aluminum layers 25 of the second level electrically connected to the lower aluminum layer 23 of the Vcc line 900 via the aluminum layer 26 of the first level which is connected to the layers 25 and 23 through contact holes 27 and the upper aluminum layers 24 of the third level connected to the respective lower aluminum layers 25 through a plurality of contact holes (not shown). Besides the above-mentioned voltage supply lines 300, 400, 500, 700, 800 and 900, other voltage supply lines 60 are provided which include parallel-arranged stripe type aluminum layers of the third level.

The aluminum layers 16, 36, 26, 28 and 38 of first level are formed on the field silicon oxide film 51 provide on the major surface of the P-type silicon substrate 50 and have 1.0 μm thickness. The aluminum wiring layers 33, 19, 23, 13, 35 and 25 of the second level having 1.2 μm thickness are formed on the first intermediate insulating film 52 made of silicon oxide or silicon nitride and having 0.5 μm thickness which covers the first level aluminum layers and the field insulator film 51. The layer 35 has 116 μm width and the layer 23 also has the width of 116 μm. The aluminum layers 32, 18, 62, 12, 22 and 24 of the third level of 1.6 μm thickness are provided on the second intermediate insulating film 53 made of silicon oxide or silicon nitride and having 0.5

μm thickness which covers the second-level aluminum layers and the first intermediate insulating film 52. The third-level aluminum layers are connected to the respective second-level layers through a plurality of contact holes provided in the second intermediate insulating film 53 as mentioned above. The stripe type aluminum layers 62 of the present invention have the width (W) of 46 μm and are arranged in parallel with each other with the constant pitch (P shown in FIG. 1C) of 66 μm. Therefore an interval between the adjacent layers 62 is 20 μm. In FIG. 1C", stripe type conductive layers 62' are positioned below a conductive layer 35', and the layers 62', 35' are in contact with each other through contact holes.

Figure 2A:
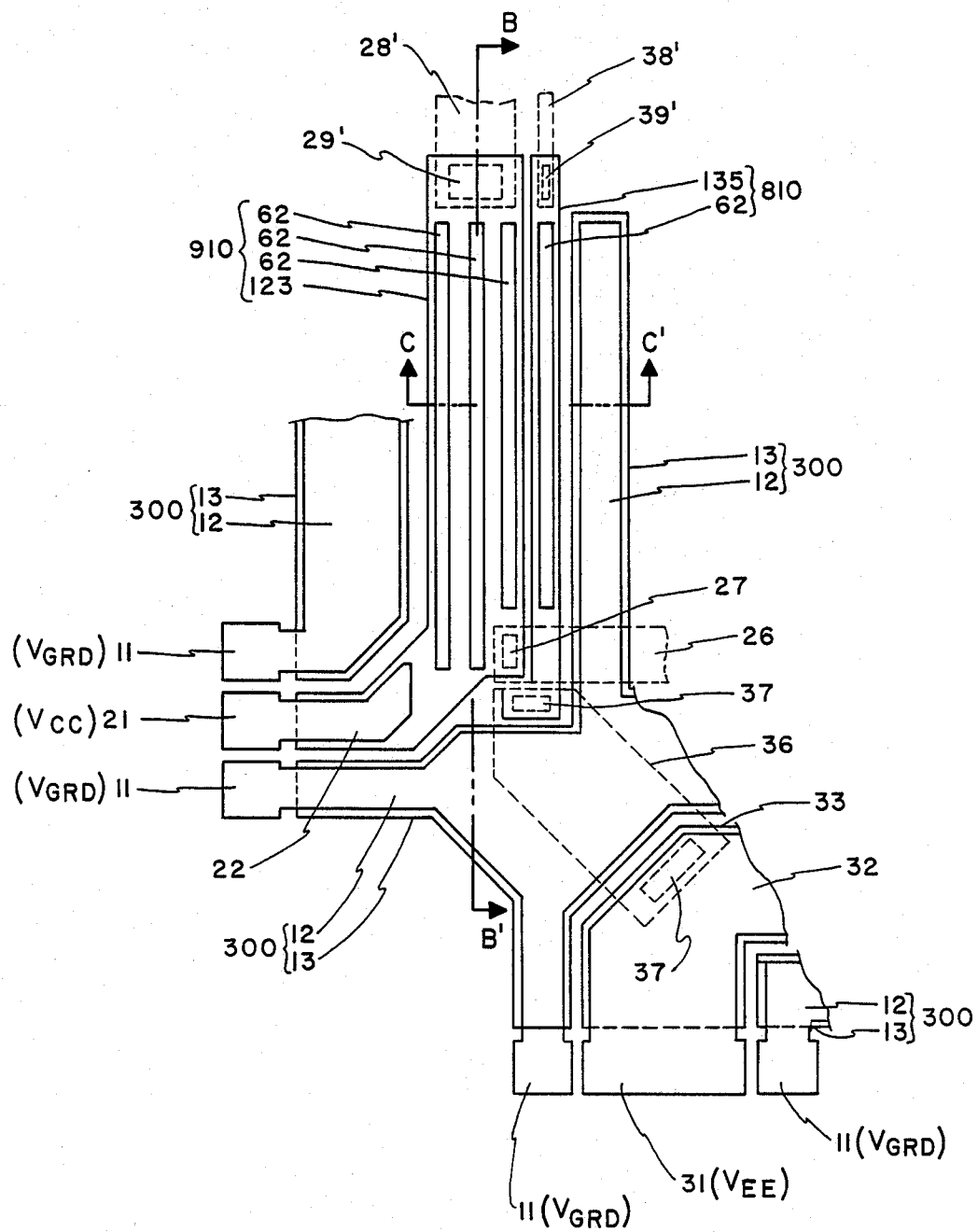
Figure 2B:
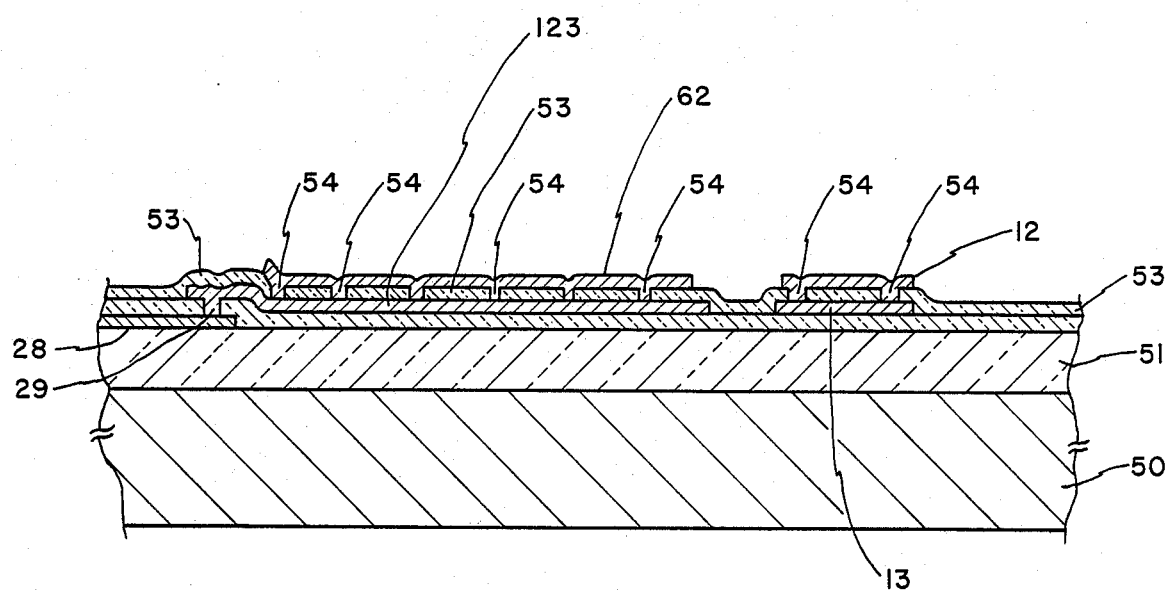
Figure 2C:
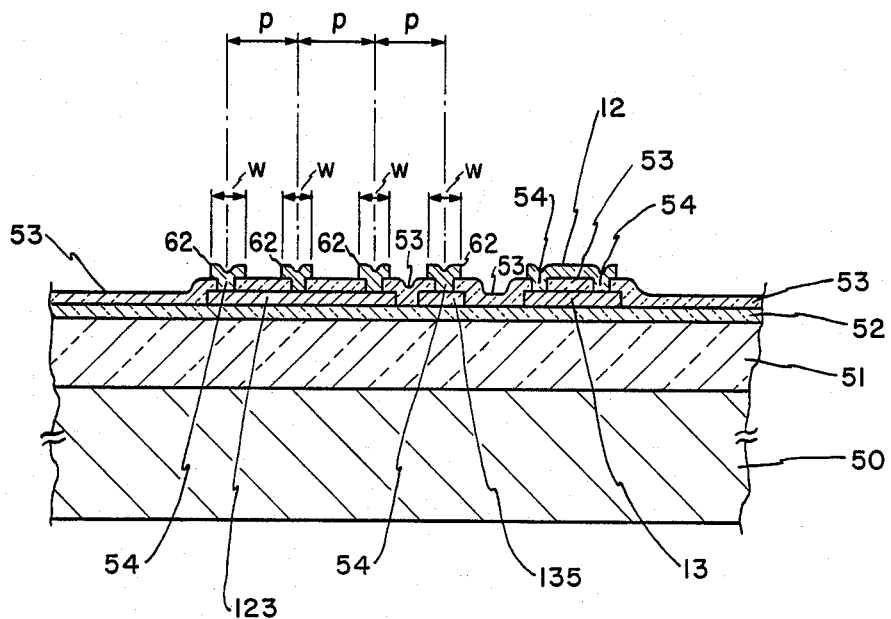

Referring to FIGS. 2A to 2C showing a second embodiment in which the gate array device includes a larger number of TT output buffer circuits (not shown) and a smaller number of ECL output buffer circuits (not shown) than in the first embodiment, the pattern of the third-level aluminum layers including the stripe type aluminum layers 62 is not changed from that of the first embodiment shown in FIG. 1A. Nevertheless, the $V_{EE}$ line 810 to the ECL output buffer circuits has a smaller width and the Vcc line 910 to the TTL output buffer circuits is wider. The pattern of the second-level aluminum layer 135 of the $V_{EE}$ line 810 is changed to have a 50 μm width and only one of the stripe type aluminum layers 62 of third level (46 μm in width) is thereby connected to the lower layer 135 through a plurality of contact holes 54 arranged in the lengthwise direction. The pattern of the second-level aluminum layer 123 of the Vcc line 910 is changed to have a 182 μm width and three the stripe-type aluminum layers 62 of third level are thereby connected to the lower layer 123 through a plurality of contact holes 54 arranged in each lengthwise direction. The width (W) and the pitch (P) of the stripe-type layers 62 shown in FIGS. 2C are the same in FIG. 1C. In FIGS. 2A to 2C, the same components as those in FIGS. 1A to 1C are indicated by the same reference numerals.

Figure 3:
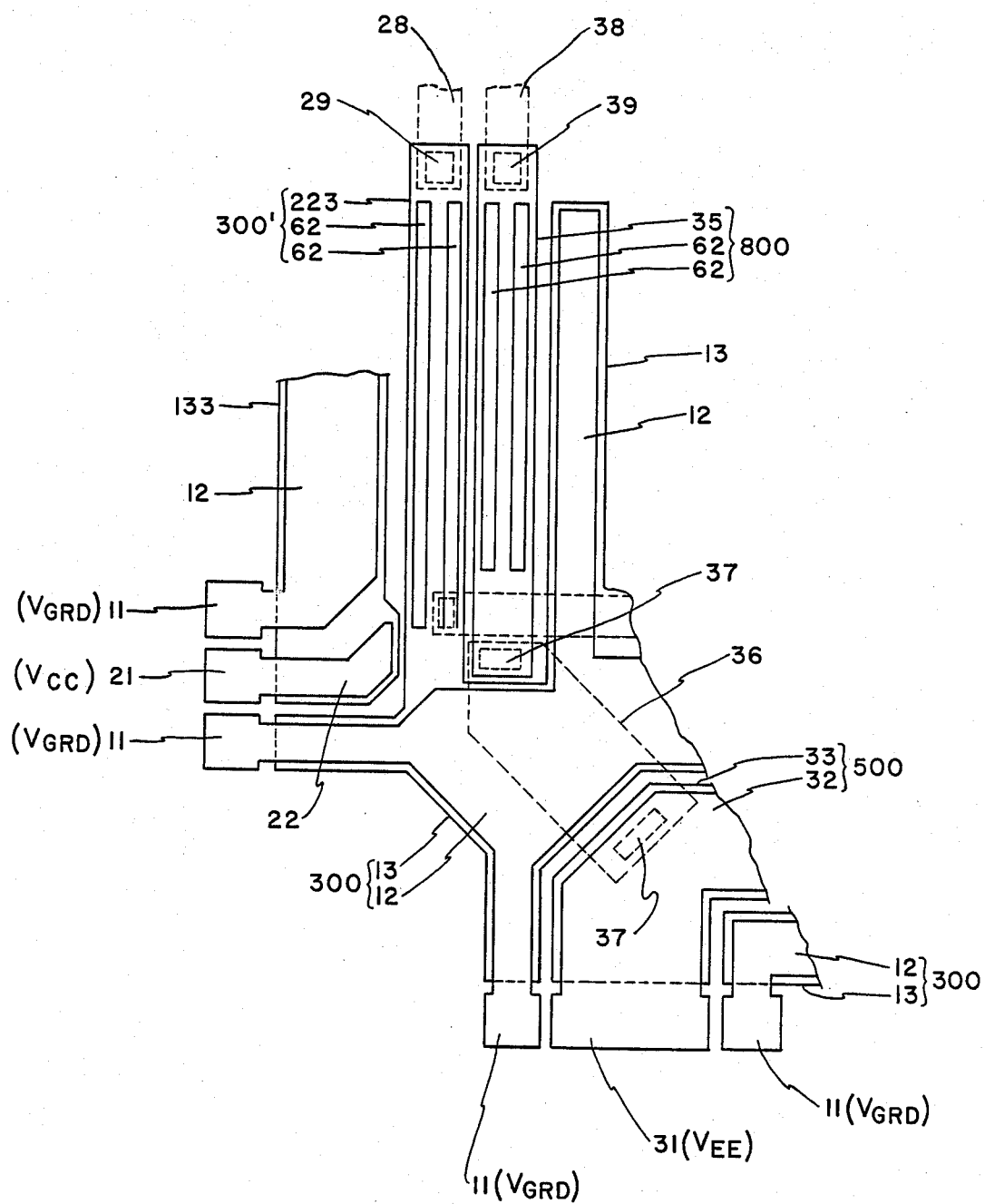

Referring to FIG. 3 showing a third embodiment in which the gate array device uses only ECL buffer circuits and no TTL buffer circuit is used, no Vcc line is provided and only $V_{GND}$ lines and $V_{EE}$ line are used. Nevertheless again, there is no change in FIG. 3 in pattern of the third-level aluminum layers including the stripe type layers 62 from that of FIG. 1A. No change in mask is therefore required. Only the pattern of the second-level aluminum layers is changed such that the lower layer 23 (in FIG. 1A) is separated from the portion under the upper layer 22 and extended towards the lower layer 13 of the central $V_{GND}$ line 300 to be connected thereto, thus becoming a lower layer 223 of another branch 300' of the $V_{GND}$ line. The layer 28 connected to this $V_{GND}$ branch line 300' is extended to ECL buffer circuits rather than TTL buffer circuits. The portion of the lower layer under the upper layer 22 is connected to the lower layer 133 of another $V_{GND}$ line. The ground potential $V_{GND}$ is applied to the bonding pad 21 connected to the short wiring 22, instead of the Vcc potential. In FIG. 3, the same components as those in FIG. 1A are indicated by the same reference numerals.

What is claimed is:

1. An integrated circuit semiconductor device comprising a semiconductor substrate, a field insulating layer formed on said substrate, first and second parallel power supply lines formed on said field insulating layer and extending in one direction with an interval between them, said first and second power supply lines being located so that no circuit element is at a part of said substrate which is under said interval between said first and second power supply lines and so that said field insulating layer is continuously formed under said first and second power supply lines and under said interval between said first and second power supply lines, said first power supply line including a first conductive layer at a first level at least first and second stripe type conductive layers at a second level located at portions which are above or below said first conductive layer so that said first and second stripe type conductive layers of said second level are positioned completely within said first conductive layer at said first level in the plan view, each of said first and second stripe type conductive layers at said second level being electrically connected to only said first conductive layer via a plurality of contact holes provided in an intermediate insulating film between said first conductive layer at said first level and said first and second stripe type conductive layers at said second level, said second power supply line including a second conductive layer at said first level and at least a third stripe type conductive layer at said second level located above or below said second conductive layer so that said third stripe type conductive layer at said second level is positioned completely within said second conductive layer of said first level in the plan view, said third stripe type conductive layer at said second level being electrically connected to only said second conductive layer via a plurality of contract holes provided in an intermediate insulating film which is between said second conductive layer at said first level and said third stripe type conductive layer at said second level, said first, second and third stripe type conductive layers belonging to said first and second power supply lines, respectively, each of said stripe type conductive layers having substantially the same width and extending in said one direction and in parallel with each other by keeping substantially the same interval between said first and second stripe type conductive layers as the interval between said second and third stripe type conductive layers.

2. An integrated semiconductor device of claim 1, in which said device is of a gate array type having TTL input/output buffer circuits and ECL input/output buffer circuits.

3. An integrated circuit semiconductor device comprising a semiconductor substrate; an insulating layer formed on a major surface of said substrate; first and second lower conductive layers formed on said insulating layer and extending in one direction and in parallel with each other, said first and second lower conductive layers being located a small interval away from each other so that no other conductive layer is located between said first and second lower conductive layer and so that no circuit element is located in a portion of said substrate which is under said interval; an insulating film covering said first and second lower conductive layers; and first, second, third and fourth upper conductive layers arranged in order and formed on said insulating film and extending in said one direction and in parallel with each other, each of said first to fourth upper conductive layers having substantially the same width; other intervals formed between said first and second upper conductive layers, between said second and third upper conductive layers and between said third and fourth upper conductive layers, said other intervals being substantially the same dimension; each of said first and second upper conductive layers being completely superimposed over said first lower conductive layer in the plan view and being connected to said first lower conductive layer by way of a plurality of contact holes which are provided in said insulating film; and each of said third and fourth upper conductive layers being completely superimposed over said second lower conductive layer in the plan view and being connected to said second lower conductive layer by way of a plurality of contact holes which are provided in said insulating film, whereby said first lower conductive layer and said first and second upper conductive layers constitute a first power supply line, and said second lower conductive layer and said third and fourth upper conductive layers constitute a second power supply line.

4. The integrated semiconductor device of claim 3, in which said device is of a gate array type having TTL input/output buffer circuits and ECL input/output buffer circuits, and said first and second power supply lines are a highest-potential power supply voltage line and a lowest-potential power supply voltage line, respectively.

5. The integrated semiconductor device of claim 3, in which one of said first and second power supply lines is a ground potential line.

6. An integrated circuit semiconductor device comprising a semiconductor substrate; and insulating layer formed on the major surface of said substrate; first and second lower conductive layers formed on said insulating layer and extending in one direction and in parallel with each other; said first and second lower conductive layers being located a small interval from each other so that no other conductive layer is located between said first and second lower conductive layers and so that no circuit element is in a portion of said substrate under said interval; an insulating film covering said first and second lower conductive layers; and first, second, third and fourth upper conductive layers arranged in order, formed on said insulating film and extending in said one direction and in parallel with each other, said first to fourth upper conductive layers having substantially the same width; and the intervals between said first and second upper conductive layers, between said second and third upper conductive layers, and between said third and fourth upper conductive layers being substantially the same dimension; each of said first, second and third upper conductive layers being completely superimposed on said first lower conductive layer in the plan view and being connected to said first lower conductive layer via a plurality of contact holes provided in said insulating film; and said fourth upper conductive layer being completely superimposed on said second lower conductive layer in the plan view and being connected to said second lower layer via a plurality of contact holes provided in said insulating film, whereby said first lower conductive layer and said first, second and third upper conductive layers constitute a first power supply line, and said second lower conductive layer and said fourth upper conductive layer constitute a second power supply line.

7. The integrated semiconductor device of claim 6, in which said device is of a gate array type having TTL input/output buffer circuits and ECL input/output buffer circuits, and said first and second power supply lines are a highest-potential power supply voltage line and a lowest-potential power supply voltage line, respectively.

* * * * *